(12) United States Patent
Fu et al.

(10) Patent No.: US 10,707,863 B2
(45) Date of Patent: Jul. 7, 2020

(54) POWER-ON RESET CIRCUIT

(71) Applicant: LONTIUM SEMICONDUCTOR CORPORATION, Hefei, Anhui (CN)

(72) Inventors: Jiaxi Fu, Anhui (CN); Cheng Tao, Anhui (CN); Xiangyu Ji, Anhui (CN); Feng Chen, Anhui (CN)

(73) Assignee: LONTIUM SEMICONDUCTOR CORPORATOIN, Hefei, Anhui (CN)

( * ) Notice: Subject to any disclaimer, the term of this patent is extended or adjusted under 35 U.S.C. 154(b) by 0 days.

(21) Appl. No.: 16/555,080

(22) Filed: Aug. 29, 2019

(65) Prior Publication Data

US 2020/0076422 A1 Mar. 5, 2020

(30) Foreign Application Priority Data

Aug. 30, 2018 (CN) .......................... 2018 1 1000487

(51) Int. Cl.
*H03K 5/153* (2006.01)
*H03K 17/22* (2006.01)

(52) U.S. Cl.
CPC .................................. *H03K 17/223* (2013.01)

(58) Field of Classification Search
CPC ........ H03K 5/2481; H03K 5/249; H03K 5/08; H03K 5/153; H03K 5/1534; H03K 3/02337; H03K 3/2885; H03K 17/22; H03K 17/223; H03K 17/58; G01R 19/16519; G06F 1/24
See application file for complete search history.

(56) References Cited

U.S. PATENT DOCUMENTS

| | | | |
|---|---|---|---|
| 5,534,804 A * | 7/1996 | Woo | H03K 17/223 327/143 |
| 7,161,396 B1 * | 1/2007 | Zhou | H03K 17/223 327/143 |
| 8,841,947 B2 * | 9/2014 | Lin | H03K 3/356191 327/143 |
| 2003/0201807 A1 * | 10/2003 | Ohbayashi | H03K 3/356008 327/143 |

* cited by examiner

*Primary Examiner* — Long Nguyen
(74) *Attorney, Agent, or Firm* — Cantor Colburn LLP

(57) ABSTRACT

A power-on reset circuit is provided. During a power-on process of the power-on reset circuit, a threshold voltage of an output signal rstn jumping from a low level to a high level is adjusted by clamp of a voltage at a node c and voltage division between a first resistor and a second resistor, and is controlled to be greater than a threshold voltage of a metal oxide semiconductor device. During a power-off process of the power-on reset circuit, a threshold voltage of the output signal rstn jumping from the high level to the low level is adjusted by increasing a voltage at a node d by means of a third resistor and voltage division between the first resistor and the third resistor, and is controlled to be greater than the threshold voltage of the metal oxide semiconductor device.

10 Claims, 5 Drawing Sheets

POWER-ON RESET CIRCUIT

CROSS REFERENCE TO RELATED APPLICATION

The present application claims priority under 35 U.S.C. § 119 to Chinese Patent Application No. 201811000487.8, filed on Aug. 30, 2018 with the Chinese Patent Office, the content of which are all incorporated herein by reference.

FIELD

The present disclosure relates to the technical field of digital integrated or digital-analog hybrid integrated circuit designs, and in particular to a power-on reset circuit.

BACKGROUND

In the power-on process of a digital integrated or digital-analog hybrid integrated circuit chip, a power-on reset circuit plays an important role. The power-on reset circuit is used to reset digital logic modules inside the chip to complete the initialization setting of the chip. After the initialization setting is completed, the power-on reset circuit releases a reset signal, and the chip enters a normal operation state. In a case that no power-on reset circuit is provided, output states of a large number of digital logic modules inside the chip are uncertain during the power-on process, which may result in logic confusion or the damage of the chip, and further results in the chip not being in the normal operation state after the power-on process is completed.

SUMMARY

A power-on reset circuit is provided in the present disclosure, by which digital logic modules inside a chip can be reset by a reset signal outputted during a power-on process, and normal initialization of the chip can be completed.

The following technical solutions are provided in the present disclosure.

The power-on reset circuit provided in the present disclosure includes: a first resistor (R1), a second resistor (R2), a third resistor (R3), a fourth resistor (R4), a first inverter (INV1), a second inverter (INV2), a first P-channel metal oxide semiconductor (PMOS) transistor (PM1), a first N-channel metal oxide semiconductor (NMOS) transistor (NM1), and a clamp device (M1), where one terminal of the first resistor (R1), a first terminal of the first PMOS transistor (PM1), a first terminal of the first inverter (INV1), and a first terminal of the second inverter (INV2) are each connected to a power supply terminal (VCC);

the other terminal of the first resistor (R1) as a node a is connected to one terminal of the second resistor (R2), a third terminal of the first PMOS transistor (PM1), and a first terminal of the NMOS transistor (NM1), and the other terminal of the second resistor (R2) as a node c is connected to a first terminal of the clamp device (M1);

a second terminal of the first NMOS transistor (NM1) as a node d is connected to one terminal of the third resistor (R3), and a second terminal of the first PMOS transistor (PM1) as a node b is connected to an input terminal of the first inverter (INV1) and one terminal of the fourth resistor (R4);

an output terminal of the first inverter (INV1) is connected to an input terminal of the second inverter (INV2), and a third terminal of the first NMOS transistor (NM1) is connected to an output terminal of the second inverter (INV2) to form a feedback loop, where the output terminal of the second inverter (INV2) serves as an output terminal of the power-on reset circuit;

a second terminal of the clamp device (M1), the other terminal of the third resistor (R3), the other terminal of the fourth resistor (R4), a second terminal of the first inverter (INV1), and a second terminal of the second inverter (INV2) are each connected to a ground terminal (GND);

in a power-on process of the power-on reset circuit, when a power supply voltage VCC is equal to zero, a voltage at each node in the power-on reset circuit is equal to zero;

before the power supply voltage VCC is increased to a voltage equal to a clamp voltage of the clamp device (M1), the clamp device (M1) is turned off, a voltage at the node a and a voltage at the node c are equal to each other and are equal to the power supply voltage VCC, the first PMOS transistor (PM1) is turned off, the node b and the node d are pulled down to the ground respectively by the fourth resistor (R4) and the third resistor (R3), an output signal rstn from the output terminal of the power-on reset circuit is at a low level, and the first NMOS transistor (NM1) is turned off;

when the power supply voltage VCC is increased to a voltage higher than the clamp voltage of the clamp device (M1), the clamp device (M1) is turned on, and a difference between the power supply voltage VCC and the voltage at the node a is insufficient to turn on the first PMOS transistor (PM1), and a voltage at the node b and a voltage of the node d are still equal to zero, the output signal rstn from the output terminal of the power-on reset circuit is at the low level, and the first NMOS transistor (NM1) is turned off;

when the power supply voltage is increased to a voltage causing the difference between the power supply voltage VCC and the voltage at the node a to be greater than an absolute value $V_{thp}$ of a threshold voltage of the first PMOS transistor (PM1), the first PMOS transistor (PM1) is turned on, a current flowing through the first PMOS transistor (PM1) flows through the fourth resistor (R4), and the voltage at the node b is increased to cause the first inverter (INV1) and the second inverter (INV2) to invert the output signal rstn of the power-on reset circuit from the low level to a high level, the first NMOS transistor (NM1) is turned on, and the voltage at the node a is rapidly pulled down to accelerate conduction of the first PMOS transistor (PM1); and during the power supply voltage VCC is continuously increased to a normal operating voltage, the output signal rstn from the output terminal of the power-on reset circuit is maintained at the high level; and in a power-off process of the power-on reset circuit, when the power supply voltage VCC is at the normal operating voltage, the output signal rstn from the output terminal of the power-on reset circuit is maintained at the high level, and a voltage at the output terminal of the power-on reset circuit is equal to the power supply voltage VCC;

when the power supply voltage VCC is decreased from the normal operating voltage to a voltage lower than a preset threshold, the output signal rstn from the output terminal of the power-on reset circuit is inverted from the high level to the low level, and during the power supply voltage VCC is continuously decreased, the output signal rstn from the output terminal of the power-on reset circuit is maintained at the low level.

Further, the clamp device (M1) is a triode (Q1).

Further, an emitter electrode of the triode (Q1) serves as the first terminal of the clamp device (M1), and a base electrode of the triode (Q1) is connected to a collector electrode of the triode (Q1), and the base electrode of the triode (Q1) serves as the second terminal of the clamp device (M1) and is ground.

Further, the clamp device (M1) is a second NMOS transistor (NM2).

Further, a first terminal of the second NMOS transistor (NM2) is connected to a third terminal of the second NMOS transistor (NM2) and serves as the first terminal of the clamping device (M1), and a second terminal of the second NMOS transistor (NM2) serves as the second terminal of the clamp device (M1) and is grounded.

Further, the first terminal of the second NMOS transistor is a drain electrode of the second NMOS transistor, the second terminal of the second NMOS transistor is a source electrode of the second NMOS transistor, and the third terminal of the second NMOS transistor is a gate electrode of the second NMOS transistor.

Further, the clamp device (M1) is a diode (D1).

Further, an anode of the diode (D1) serves as the first terminal of the clamp device (M1), and a cathode of the diode (D1) serves as the second terminal of the clamp device (M1).

Further, the first terminal of the first PMOS transistor (PM1) is a source electrode of the first PMOS transistor, the second terminal of the first PMOS transistor (PM1) is a drain electrode of the first PMOS transistor, and the third terminal of the first PMOS transistor (PM1) is a gate electrode of the first PMOS transistor.

Further, the first terminal of the first NMOS transistor (NM1) is a drain electrode of the first NMOS transistor, the second terminal of the first NMOS transistor (NM1) is a source electrode of the first NMOS transistor, and the third terminal of the first NMOS transistor (NM1) is a gate electrode of the first NMOS transistor.

It can be seen from the above technical solutions that, a power-on reset circuit is provided in the present disclosure. The power-on reset circuit includes a first resistor, a second resistor, a third resistor, a fourth resistor, a first inverter, a second inverter, a first PMOS transistor, a first NMOS transistor, and a clamp device. During the power-on process, a threshold voltage of the output signal rstn jumping from a low level to a high level in the power-on process is adjusted by clamp of the voltage at the node c and voltage division between the first resistor and the second resistor, and the power-on threshold voltage is controlled to be greater than a threshold voltage of the MOS device. During the power-off process, a threshold voltage of the output signal rstn jumping from the high level to the low level in the power-off process is adjusted by increasing the voltage at the node d by means of the third resistor and voltage division between the first resistor and the third resistor, and the power-off threshold voltage is controlled to be greater than the threshold voltage of the MOS device. Further, feedback of the output signal rstn to the first NMOS transistor produces a hysteresis effect, that is, the power-on threshold voltage is greater than the power-off threshold voltage, eliminating the oscillation due to instability of the power supply voltage during the power-on process or the power-off process.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. Apparently, the drawings in the following description only show some embodiments of the present disclosure, and other drawings may be obtained by those skilled in the art from the drawings without any creative work.

DETAILED DESCRIPTION OF THE EMBODIMENTS

Figure 1:
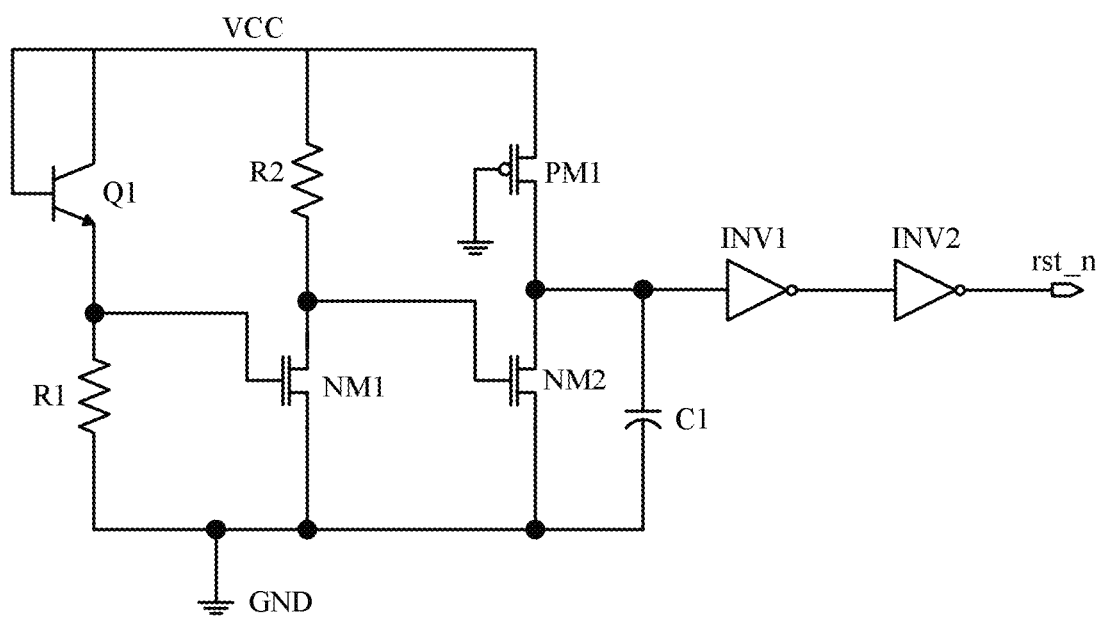
FIG. 1 is a schematic structural diagram of a power-on reset circuit in the conventional technology.

Reference is made to FIG. 1, which is a schematic structural diagram of a power-on reset circuit in the conventional technology. As shown in FIG. 1, a clamp device in the power-on reset circuit is implemented by an NPN triode. In a complementary metal oxide semiconductor (CMOS) process, the number of masks in the NPN triode is larger by one than the number of masks in a PNP triode, so that a production cost is increased in the case of the NPN triode. In addition, during the power-on process, power supply fluctuation may result in a problem such as oscillation of an output reset signal rstn of the power-on reset circuit shown in FIG. 1.

A power-on reset circuit is provided according to an embodiment of the present disclosure. In the power-on reset circuit, a PNP triode is used as a clamp device to reduce the production cost, a feedback hysteresis technology is used to effectively avoid the oscillation, and a threshold voltage of the output signal jumping from a low level to a high level during the power-on process or from the high level to the low level during the power-off process is adjusted by adjusting a ratio between resistances of resistors. Further, the power-on reset circuit according to the embodiment of the present disclosure may be applied in applications in which a lower supply voltage is provided.

Technical solutions of embodiments of the present disclosure are clearly and completely described in the following in conjunction with the drawings of the embodiments of the present disclosure. Apparently, the embodiments described in the following are only some embodiments of the present disclosure, rather than all the embodiments. Any other embodiments obtained by those skilled in the art based on the embodiments in the present disclosure without any creative work fall in the protection scope of the present disclosure.

Figure 2:
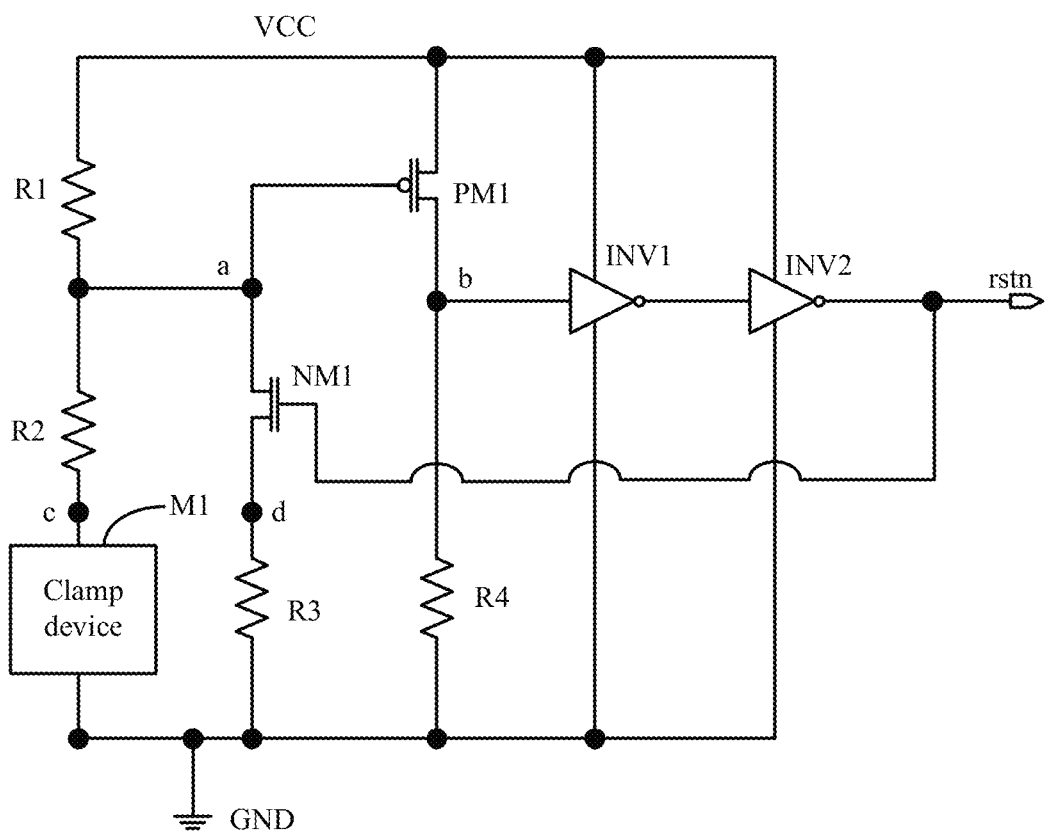
FIG. 2 is a schematic structural diagram of a power-on reset circuit according to an embodiment of the present disclosure.

Reference is made to FIG. 2, which shows a power-on reset circuit according to an embodiment of the present disclosure. The power-on reset circuit includes: a first resistor R1, a second resistor R2, a third resistor R3, a fourth resistor R4, a first inverter INV1, a second inverter INV2, a first PMOS transistor PM1, a first NMOS transistor NM1, and a clamp device M1.

One terminal of the first resistor R1, a first terminal of the first PMOS transistor PM1, a first terminal of the first inverter INV1, and a first terminal of the second inverter INV2 are each connected to a power supply terminal VCC. The other terminal of the first resistor R1 as a node a is connected to one terminal of the second resistor R2, a third terminal of the first PMOS transistor PM1, and a first terminal of the NMOS transistor NM1. The other terminal of the second resistor R2 as a node c is connected to a first terminal of the clamp device Ml. A second terminal of the first NMOS transistor NM1 as a node d is connected to one terminal of the third resistor R3. A second terminal of the first PMOS transistor PM1 as a node b is connected to an input terminal of the first inverter INV1, and one terminal of the fourth resistor R4. An output terminal of the first inverter INV1 is connected to an input terminal of the second inverter INV2. A third terminal of the first NMOS transistor NM1 is connected to an output terminal of the second inverter INV2 to form a feedback loop. The output terminal of the second inverter INV2 serves as an output terminal of the power-on reset circuit. A second terminal of the clamp device Ml, the other terminal of the third resistor R3, the other terminal of the fourth resistor R4, a second terminal of the first inverter INV1, and a second terminal of the second inverter INV2 are each connected to a ground terminal GND.

A power-on process of the power-on reset circuit is described as follows. When a power supply voltage VCC is equal to zero, a voltage at each node in the power-on reset circuit is equal to zero. Before the power supply voltage VCC is increased to a voltage equal to a clamp voltage of the clamp device M1, the clamp device M1 is turned off, a voltage at the node a and a voltage at the node c are equal to each other and are equal to the power supply voltage VCC, the first PMOS transistor PM1 is turned off, the node b and the node d are pulled down to the ground respectively by the fourth resistor R4 and the third resistor R3, an output signal rstn from the output terminal of the power-on reset circuit is at a low level, and the first NMOS transistor NM1 is turned off. When the power supply voltage VCC is increased to a voltage higher than the clamp voltage of the clamp device M1, the clamp device M1 is turned on, and a difference between the power supply voltage VCC and the voltage at the node a is insufficient to turn on the first PMOS transistor PM1, and a voltage at the node b and a voltage of the node d are still equal to zero, the output signal rstn from the output terminal of the power-on reset circuit is at the low level, and the first NMOS transistor NM1 is turned off. When the power supply voltage is increased to a voltage causing the difference between the power supply voltage VCC and the voltage at the node a to be greater than an absolute value $V_{thp}$ of a threshold voltage of the first PMOS transistor PM1, the first PMOS transistor PM1 is turned on, a current flowing through the first PMOS transistor PM1 flows through the fourth resistor R4, and the voltage at the node b is increased to cause the first inverter INV1 and the second inverter INV2 to invert the output signal rstn of the power-on reset circuit from the low level to a high level, the first NMOS transistor NM1 is turned on, and the voltage at the node a is rapidly pulled down to accelerate conduction of the first PMOS transistor PM1. During the power supply voltage VCC is continuously increased to a normal operating voltage, the output signal rstn from the output terminal of the power-on reset circuit is maintained at the high level.

A power-off process of the power-on reset circuit is described as follows. When the power supply voltage VCC is at the normal operating voltage, the output signal rstn from the output terminal of the power-on reset circuit is maintained at the high level, and a voltage at the output terminal of the power-on reset circuit is equal to the power supply voltage VCC. When the power supply voltage VCC is decreased from the normal operating voltage to a voltage lower than a preset threshold, the output signal rstn from the output terminal of the power-on reset circuit is inverted from the high level to the low level. During the power supply voltage VCC is continuously decreased, the output signal rstn from the output terminal of the power-on reset circuit is maintained at the low level.

During the power-on process, a threshold voltage of the output signal rstn jumping from a low level to a high level in the power-on process is adjusted by clamp of the voltage at the node c and voltage division between the first resistor R1 and the second resistor R2, and the power-on threshold voltage is controlled to be greater than a threshold voltage of the MOS device. During the power-off process, a threshold voltage of the output signal rstn jumping from the high level to the low level in the power-off process is adjusted by increasing the voltage at the node d by means of the third resistor R3 and voltage division between the first resistor R1 and the third resistor R3, and the power-off threshold voltage is controlled to be greater than the threshold voltage of the MOS device. Further, feedback of the output signal rstn to the first NMOS transistor NM1 produces a hysteresis effect, that is, the power-on threshold voltage is greater than the power-off threshold voltage, eliminating the oscillation due to instability of the power supply voltage during the power-on process or the power-off process.

Figure 3:
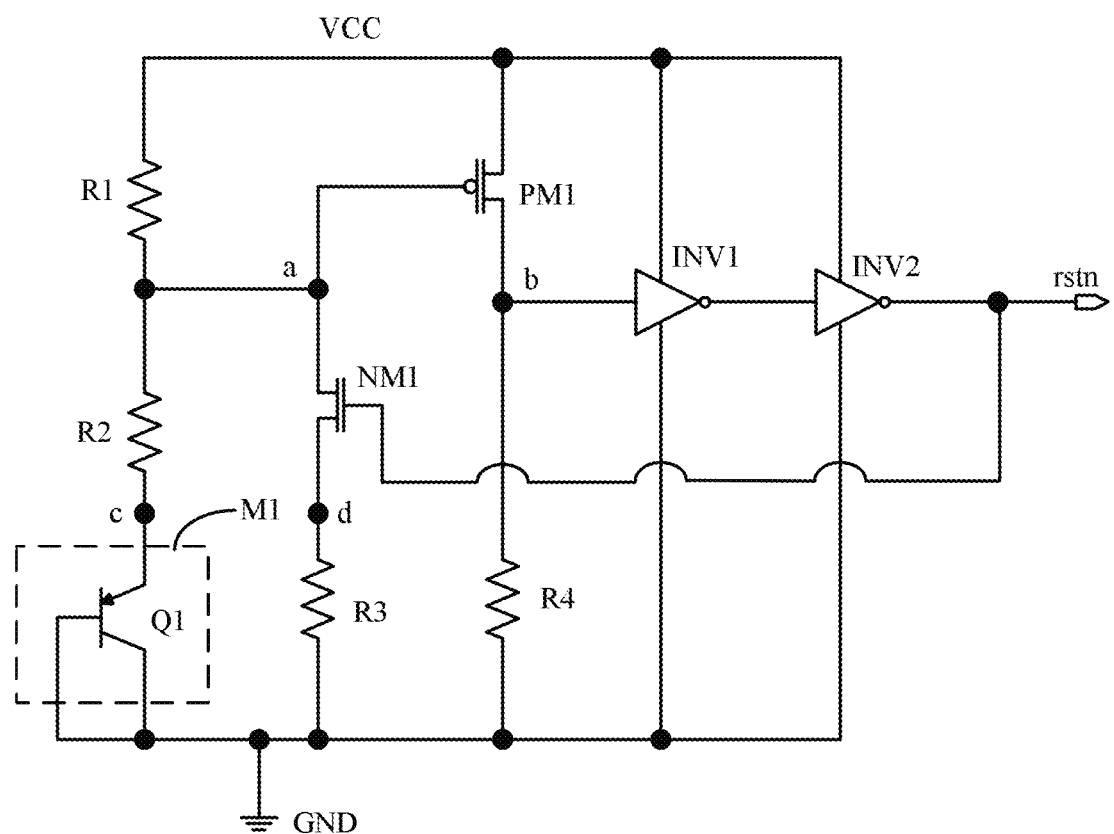
FIG. 3 is a schematic diagram showing a detailed configuration of the power-on reset circuit according to the embodiment of the present disclosure.
Figure 4:
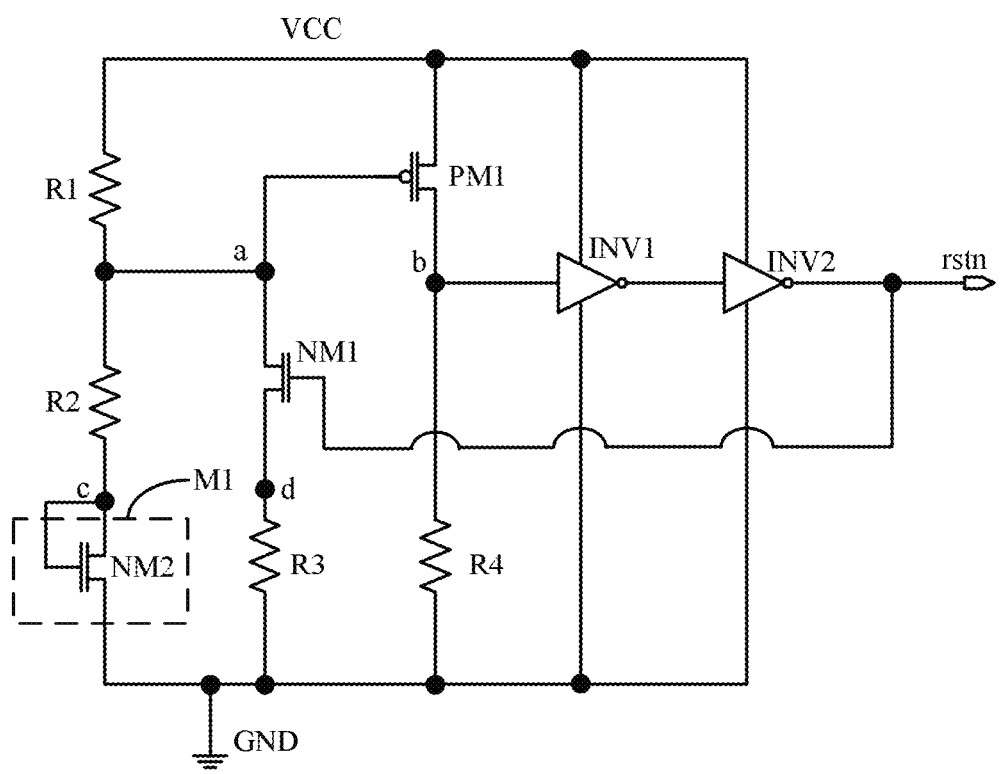
FIG. 4 is a schematic diagram showing another detailed configuration of the power-on reset circuit according to the embodiment of the present disclosure.
Figure 5:
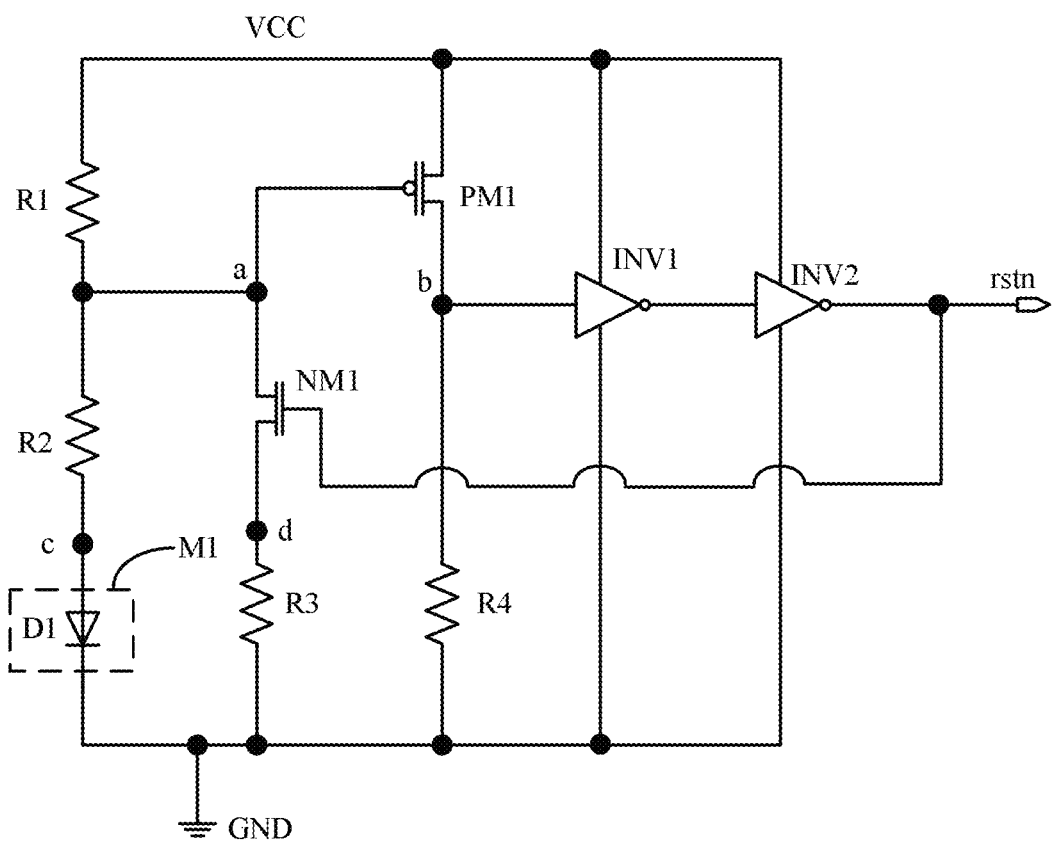
FIG. 5 is a schematic diagram showing another detailed configuration of the power-on reset circuit according to the embodiment of the present disclosure.

It should be noted that the clamp device M1 may be implemented by a triode Q1, a second NMOS transistor NM2, or a diode D1, which are respectively shown in FIG. 3, FIG. 4 and FIG. 5.

As shown in FIG. 3, the clamp device M1 is implemented by the triode Q1. An emitter electrode of the triode Q1 serves as the first terminal of the clamp device Ml. A base electrode of the triode Q1 is connected to a collector electrode of the triode Q1. The base electrode of the triode Q1 serves as the second terminal of the clamp device M1 and is grounded.

As shown in FIG. 4, the clamp device M1 is implemented by the second NMOS transistor NM2. A first terminal of the second NMOS transistor NM2 is connected to a third terminal of the second NMOS transistor NM2 and serves as the first terminal of the clamping device M1. A second terminal of the second NMOS transistor NM2 serves as the second terminal of the clamp device M1 and is grounded.

Specifically, the first terminal of the second NMOS transistor is a drain electrode of the second NMOS transistor, the second terminal of the second NMOS transistor is a source electrode of the second NMOS transistor, and the third terminal of the second NMOS transistor is a gate electrode of the second NMOS transistor.

In the embodiment shown in FIG. 4, a MOS transistor is used as the clamp device, and the power-on reset circuit can be applied in applications in which a lower supply voltage is provided.

As shown in FIG. 5, the clamp device M1 is implemented by the diode D1. An anode of the diode D1 serves as the first terminal of the clamp device M1, and a cathode of the diode D1 serves as the second terminal of the clamp device M1.

Specifically, the first terminal of the first PMOS transistor PM1 is a source electrode of the first PMOS transistor, the second terminal of the first PMOS transistor PM1 is a drain electrode of the first PMOS transistor, and the third terminal of the first PMOS transistor PM1 is a gate electrode of the first PMOS transistor. The first terminal of the first NMOS transistor NM1 is a drain electrode of the first NMOS transistor, the second terminal of the first NMOS transistor NM1 is a source electrode of the first NMOS transistor, and the third terminal of the first NMOS transistor NM1 is a gate electrode of the first NMOS transistor.

Next, an operation principle of the power-on reset circuit is described taking the triode Q1 as an example of the clamp device M1.

As shown in FIG. 3, the clamp device M1 is implemented by the triode Q1, and the triode Q1 is a PNP triode, the transistor PM1 is a PMOS transistor, and the transistor NM1 is an NMOS transistor. It is assumed that, a clamp voltage of the triode Q1 is expressed as $V_q$, the absolute value of the threshold voltage of the transistor PM1 is expressed as $V_{thp}$, and a threshold voltage of the transistor NM1 is expressed as $V_{thn}$. Reference numerals R1, R2, R3 and R4 represent resistors. Reference numerals INV1 and INV2 represent inverters. One terminal of the first resistor R1 is connected to the power supply terminal VCC, and the other terminal of the first resistor R1 is connected to the node a. The two terminals of the second resistor R2 are respectively connected to the node a and the node c. The base electrode and the collector electrode of the triode Q1 are grounded, and the emitter electrode of the triode Q1 is connected to the node c. The source electrode of the transistor PM1 is connected to the power supply terminal VCC, and the gate electrode and the drain electrode of the transistor PM1 are respectively connected to the node a and the node b. The drain electrode and the source electrode of the transistor NM1 are respectively connected to the node a and the node d, and the gate electrode of the transistor NM1 is connected to the output terminal of the power-on reset circuit to form the feedback loop. The two terminals of the third resistor R3 are respectively connected to the node d and the ground terminal GND. The two terminals of the fourth resistor R4 are respectively connected to the node b and the ground terminal GND. The signal of the node b is transmitted through the first inverter INV1 and the second inverter INV2 to generate a reset signal rstn.

Specifically, the power-on process of the power-on reset circuit is described as follows.

Before the power-on process is performed, the power supply voltage VCC is equal to zero, and voltages at all nodes in the FIG. 3 are each equal to zero, as shown in FIG. 3. When the power supply voltage is greater than zero and less than $V_q$, i.e., in the case of $0<VCC<V_q$, the triode Q1 is turned off, the voltage at the node a and the voltage at the node c are equal to each other and are equal to the power supply voltage VCC, i.e., $V_a=V_c=VCC$. In this case, the first PMOS transistor PM1 is turned off, the voltage $V_b$ at the node b is equal to zero (i.e., $V_b=0$), the output signal rstn from the output terminal of the power-on reset circuit is at a low level, and the first NMOS transistor NM1 is turned off, and the voltage $V_d$ at the node d is equal to zero (i.e., $V_d=0$). In the case of $V_q<VCC<V_{TH}$, where $V_{TH}$ represents an upper threshold voltage, the triode Q1 is turned on, and the voltage $V_c$ at the node c is equal to the clamp voltage $V_q$ of the triode Q1 (i.e., $V_c=V_q$), and the first PMOS transistor PM1 is turned off, and the voltage $V_b$ at the node b is equal to zero (i.e., $V_b=0$), and the output signal rstn from the output terminal of the power-on reset circuit is at the low level, and the first NMOS transistor NM1 is turned off, and the voltage $V_d$ at the node d is equal to zero (i.e., $V_d=0$). Since the power supply voltage immediately after the first PMOS transistor PM1 is turned on is equal to the upper threshold voltage $V_{TH}$ (where the absolute value $V_{thp}$ of the threshold voltage of the first PMOS transistor PM1 is obtained by subtracting a voltage at the gate electrode of the first PMOS transistor PM1 from a voltage at the source electrode of the first PMOS transistor PM1), the voltage $V_a$ at the gate electrode of the first PMOS transistor PM1 and the voltage $V_{TH}$ at the source electrode of the first PMOS transistor PM1 are expressed as follows:

$$V_a=V_q+(V_{TH}-V_q)*R2/(R1+R2) \tag{1}$$

$$V_{TH}-V_a=V_{thp} \tag{2}$$

By substituting formula (1) into formula (2), the following formula (3) is obtained:

$$V_{TH}=V_q+V_{thp}*(1+R2/R1) \tag{3}$$

It can be seen from formula (3) that, the upper threshold voltage $V_{TH}$ may be adjusted by changing the ratio of R2/R1.

When the power supply voltage VCC is greater than or equal to $V_{TH}$, i.e., $VCC \geq V_{TH}$, the first PMOS transistor PM1 is turned on, the current flowing through the first PMOS transistor PM1 flows through the fourth resistor R4, and the voltage $V_b$ at the node b is rapidly increased to cause the first inverter INV1 and the second inverter INV2 to invert the output signal rstn from the output terminal of the power-on reset circuit from the low level to a high level, the first NMOS transistor NM1 is turned on, and the voltage at the node a is pulled down to accelerate the conduction of the first PMOS transistor PM1, and the voltage $V_b$ at the node b is pulled up to a voltage close to the power supply voltage VCC. During the power supply voltage VCC is continuously increased to a normal operating voltage, the output signal rstn from the output terminal of the power-on reset circuit is maintained at the high level.

Specifically, the power-off process of the power-on reset circuit is described as follows.

When the power supply voltage VCC is greater than $V_{TL}$, where $V_{TL}$ represents a lower threshold voltage, the output signal rstn from the output terminal of the power-on reset circuit is maintained at the high level, and the voltage at the output terminal of the power-on reset circuit is equal to the power supply voltage VCC. When the power supply voltage VCC is less than or equal to $V_{TL}$, i.e., $VCC \geq V_{TL}$, the jumping process of the output signal rstn from the output terminal of the power-on reset circuit varies depending on an order in which the first PMOS transistor PM1 and the first NMOS transistor NM1 are turned off.

In a case that the first PMOS transistor PM1 is firstly turned off and the first NMOS transistor NM1 is then turned off, the jumping process is described as follows.

The first PMOS transistor PM1 is turned off and is discharged via the fourth resistor R4, so that the voltage at the node b is decreased to cause the first inverter INV1 and the second inverter INV2 to invert the output signal rstn from the output terminal of the power-on reset circuit from the high level to the low level. Then, the first NMOS transistor NM1 is turned off, and the voltage at the node a is increased to accelerate the turn-off of the first PMOS transistor PM1.

Specifically, the power supply voltage VCC immediately after the first PMOS transistor PM1 is turned off is equal to $V_{TL}$, i.e., $$V_{TL}-V_a=V_{thp} \tag{4}$$

If the triode Q1 is turned off at this time instant and an on-resistance of the first NMOS transistor NM1 is equal to zero, the following formula (5) is obtained:

$$V_a=V_{TL}*[R3/(R1+R3)] \tag{5}$$

By substituting formula (5) into formula (4), the following formula (6) is obtained:

$$V_{TL}=V_{thp}*(1+R3/R1) \qquad (6)$$

If the triode Q1 is turned on at this time instant and the on-resistance of the first NMOS transistor NM1 is equal to zero, the following formula (7) is obtained:

$$V_a > V_q \qquad (7)$$

By substituting formula (7) into formula (4), the following formula (8) is obtained:

$$V_{TL} > V_{thp}+V_q \qquad (8)$$

In a case that the first NMOS transistor NM1 is firstly turned off and the first PMOS transistor PM1 is then turned off, the jumping process is described as follows.

The first NMOS transistor NM1 is turned off, the voltage at the node a is increased to cause the first PMOS transistor PM1 to be turned off. The first PMOS transistor PM1 is discharged via the fourth resistor R4, so that the voltage at the node b is decreased to cause the first inverter INV1 and the second inverter INV2 to invert the output signal rstn from the output terminal of the power-on reset circuit from the high level to the low level, to accelerate the turn-off of the first NMOS transistor NM1.

Specifically, when the first NMOS transistor NM1 is turned off, the following formula (9) is obtained:

$$V_{TL}-V_d=V_{thn} \qquad (9)$$

If the triode Q1 is turned off at this time instant and the on-resistance of the first NMOS transistor NM1 is equal to zero, the following formula (10) is obtained:

$$V_d=V_a=V_{TL}*[R3/(R1+R3)] \qquad (10)$$

By substituting formula (10) into formula (9), the following formula (11) is obtained:

$$V_{TL}=V_{thn}*(1+R3/R1) \qquad (11)$$

If the triode Q1 is turned on at this time instant and the on-resistance of the first NMOS transistor NM1 is equal to zero, the following formula (12) is obtained:

$$V_d=V_a > V_q \qquad (12)$$

By substituting formula (12) into formula (9), the following formula (13) is obtained:

$$V_{TL} > V_{thn}+V_q \qquad (13)$$

Figure 6:
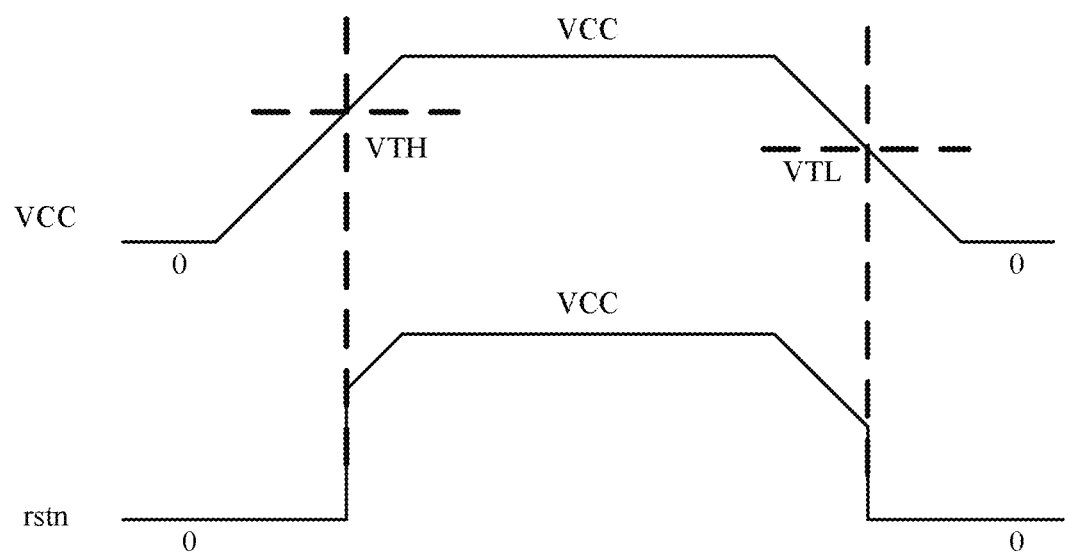
FIG. 6 is a schematic diagram showing an output signal and an output signal waveform of the power-on reset circuit according to the embodiment of the present disclosure.

It can be seen from the above that, no matter whether the first NMOS transistor NM1 or the first PMOS transistor PM1 is firstly turned off, $V_{TL}$ is greater than the threshold voltage of the MOS device, and the upper threshold voltage should be ensured to be greater than the lower threshold voltage to achieve the hysteresis jumping, so as to avoid the oscillation caused during the power-on process. As shown in FIG. 6, it is assumed that, the power-on reset signal is active at the low level. During the power-on process, the power-on reset circuit detects a supply voltage of a digital module. When the supply voltage is less than a certain threshold voltage $V_{TH}$ (an upper threshold voltage), the power-on reset circuit outputs a low level. After the supply voltage is higher than the threshold voltage $V_{TH}$, the power-on reset circuit outputs a high level (the power supply voltage). During a process that the voltage of the chip is decreased, when the supply voltage is greater than a certain threshold voltage $V_{TL}$ (a lower threshold voltage), the power-on reset circuit outputs a high level (the power supply voltage). After the supply voltage is lower than the threshold voltage $V_{TL}$, the power-on reset circuit outputs a low level.

A power-on reset circuit is provided according to an embodiment of the present disclosure. The power-on reset circuit includes a first resistor, a second resistor, a third resistor, a fourth resistor, a first inverter, a second inverter, a first PMOS transistor, a first NMOS transistor, and a clamp device. During the power-on process, a threshold voltage of the output signal rstn jumping from a low level to a high level in the power-on process is adjusted by clamp of the voltage at the node c and voltage division between the first resistor and the second resistor, and the power-on threshold voltage is controlled to be greater than a threshold voltage of the MOS device. During the power-off process, a threshold voltage of the output signal rstn jumping from the high level to the low level in the power-off process is adjusted by increasing the voltage at the node d by means of the third resistor and voltage division between the first resistor and the third resistor, and the power-off threshold voltage is controlled to be greater than the threshold voltage of the MOS device. Further, feedback of the output signal rstn to the first NMOS transistor produces a hysteresis effect, that is, the power-on threshold voltage is greater than the power-off threshold voltage, eliminating the oscillation due to instability of the power supply voltage during the power-on process or the power-off process.

It should be noted that the relationship terminologies such as "first" and "second" are only used herein to distinguish one entity or operation from another, rather than to necessitate or imply that the actual relationship or order exists between the entities or operations. Furthermore, terms of "include", "comprise" or any other variants are intended to be non-exclusive. Therefore, an article or a device including a series of elements includes not only the elements but also other elements that are not enumerated, or further includes elements inherent for the article or the device. Unless expressively limited otherwise, the statement "comprising (including) one . . . " does not exclude the case that other similar elements may exist in the article or the device.

Based on the above description of the disclosed embodiments, those skilled in the art can implement or carry out the present disclosure. It is apparent for those skilled in the art to make various modifications to these embodiments. The general principle defined herein may be applied to other embodiments without departing from the spirit or scope of the present disclosure. Therefore, the present disclosure is not limited to the embodiments illustrated herein, but should be defined by the widest scope consistent with the principle and novel features disclosed herein.

The invention claimed is:

1. A power-on reset circuit, comprising: a first resistor, a second resistor, a third resistor, a fourth resistor, a first inverter, a second inverter, a first P-channel metal oxide semiconductor (PMOS) transistor, a first N-channel metal oxide semiconductor (NMOS) transistor, and a clamp device, wherein one terminal of the first resistor, a first terminal of the first PMOS transistor, a first terminal of the first inverter, and a first terminal of the second inverter are each connected to a power supply terminal;

the other terminal of the first resistor as a first node is connected to one terminal of the second resistor, a third terminal of the first PMOS transistor, and a first terminal of the NMOS transistor, and the other terminal of the second resistor as a third node is connected to a first terminal of the clamp device;

a second terminal of the first NMOS transistor as a fourth node is connected to one terminal of the third resistor, and a second terminal of the first PMOS transistor as a second node is connected to an input terminal of the first inverter and one terminal of the fourth resistor;

an output terminal of the first inverter is connected to an input terminal of the second inverter, and a third terminal of the first NMOS transistor is connected to an output terminal of the second inverter to form a feedback loop, wherein the output terminal of the second inverter serves as an output terminal of the power-on reset circuit;

a second terminal of the clamp device, the other terminal of the third resistor, the other terminal of the fourth resistor, a second terminal of the first inverter, and a second terminal of the second inverter are each connected to a ground terminal;

in a power-on process of the power-on reset circuit,
  when a power supply voltage is equal to zero, a voltage at each node in the power-on reset circuit is equal to zero;
  before the power supply voltage is increased to a voltage equal to a clamp voltage of the clamp device, the clamp device is turned off, a voltage at the first node and a voltage at the third node are equal to each other and are equal to the power supply voltage, the first PMOS transistor is turned off, the second node and the fourth node are pulled down to the ground respectively by the fourth resistor and the third resistor, an output signal from the output terminal of the power-on reset circuit is at a low level, and the first NMOS transistor is turned off;
  when the power supply voltage is increased to a voltage higher than the clamp voltage of the clamp device, the clamp device is turned on, and a difference between the power supply voltage and the voltage at the first node is insufficient to turn on the first PMOS transistor, and a voltage at the second node and a voltage of the fourth node are still equal to zero, the output signal from the output terminal of the power-on reset circuit is at the low level, and the first NMOS transistor is turned off;
  when the power supply voltage is increased to a voltage causing the difference between the power supply voltage and the voltage at the first node to be greater than an absolute value of a threshold voltage of the first PMOS transistor, the first PMOS transistor is turned on, a current flowing through the first PMOS transistor flows through the fourth resistor, and the voltage at the second node is increased to cause the first inverter and the second inverter to invert the output signal of the power-on reset circuit from the low level to a high level, the first NMOS transistor is turned on, and the voltage at the first node is rapidly pulled down to accelerate conduction of the first PMOS transistor; and
  during the power supply voltage is continuously increased to a normal operating voltage, the output signal from the output terminal of the power-on reset circuit is maintained at the high level; and in a power-off process of the power-on reset circuit,
  when the power supply voltage is at the normal operating voltage, the output signal from the output terminal of the power-on reset circuit is maintained at the high level, and a voltage at the output terminal of the power-on reset circuit is equal to the power supply voltage;
  when the power supply voltage is decreased from the normal operating voltage to a voltage lower than a preset threshold, the output signal from the output terminal of the power-on reset circuit is inverted from the high level to the low level, and
  during the power supply voltage is continuously decreased, the output signal from the output terminal of the power-on reset circuit is maintained at the low level.

2. The power-on reset circuit according to claim 1, wherein the clamp device is a triode.

3. The power-on reset circuit according to claim 2, wherein an emitter electrode of the triode serves as the first terminal of the clamp device, and a base electrode of the triode is connected to a collector electrode of the triode, and the base electrode of the triode serves as the second terminal of the clamp device and is ground.

4. The power-on reset circuit according to claim 1, wherein the clamp device is a second NMOS transistor.

5. The power-on reset circuit according to claim 4, wherein a first terminal of the second NMOS transistor is connected to a third terminal of the second NMOS transistor and serves as the first terminal of the clamping device, and a second terminal of the second NMOS transistor serves as the second terminal of the clamp device and is grounded.

6. The power-on reset circuit according to claim 5, wherein the first terminal of the second NMOS transistor is a drain electrode of the second NMOS transistor, the second terminal of the second NMOS transistor is a source electrode of the second NMOS transistor, and the third terminal of the second NMOS transistor is a gate electrode of the second NMOS transistor.

7. The power-on reset circuit according to claim 1, wherein the clamp device is a diode.

8. The power-on reset circuit according to claim 7, wherein an anode of the diode serves as the first terminal of the clamp device, and a cathode of the diode serves as the second terminal of the clamp device.

9. The power-on reset circuit according to claim 1, wherein the first terminal of the first PMOS transistor is a source electrode of the first PMOS transistor, the second terminal of the first PMOS transistor is a drain electrode of the first PMOS transistor, and the third terminal of the first PMOS transistor is a gate electrode of the first PMOS transistor.

10. The power-on reset circuit according to claim 1, wherein the first terminal of the first NMOS transistor is a drain electrode of the first NMOS transistor, the second terminal of the first NMOS transistor is a source electrode of the first NMOS transistor, and the third terminal of the first NMOS transistor is a gate electrode of the first NMOS transistor.

* * * * *